United States Patent Office 3,698,904

Patented Oct. 17, 1972

3,698,904

COMPOSITION FOR DEVELOPING PHOTOPOLYMERIZABLE LITHOGRAPHIC PLATE ELEMENTS COMPRISING A DEVELOPER BASE AGENT, AN INK-RECEPTIVITY-AFFORDING AGENT AND A DESENSITIZER

Hisaaki Fukui and Taketoshi Araki, Tokyo, Japan, assignors to Asahi Kasei Kogyo Kabushiki Kaisha, Osaka, Japan No Drawing. Filed July 6, 1970, Ser. No. 52,728
Claims priority, application Japan, July 23, 1969, 44/57,671
Int. Cl. G03c 5/24
U.S. Cl. 96—48 28 Claims

ABSTRACT OF THE DISCLOSURE

Developer composition for a lithographic plate which is to be used for the photopolymerized layer obtained by exposing to actinic light a selected area of a coating of a photopolymerizable layer from a specified photosensitizing solution consisting of (I) a photopolymerizable component comprising an unsaturated polyester, at least one ethylenically unsaturated monomer, a photopolymerization initiator and a thermal polymerization inhibitor and (II) at least one solvent. Said developer composition consists of at least one developer base agent, at least one ink-receptivity affording agent, at least one desensitizer and, if necessary, at least one etching agent and enables to attain effects of ink-receptivity, densensitization and etching simultaneously with development by one time application of one solution.

DESCRIPTION

This invention relates to a composition for developing a lithographic plate having a photopolymerized layer obtained by exposing to actinic light a selected area of a coating of a photopolymerizable layer from a specified photosensitizing solution containing a photopolymerizable component, which composition enables to attain effects of ink-receptivity, desensitization and etching simultaneously with development by one time application of one solution.

Heretofore water has been used as a developer for lithographic photosensitizing plates. In cases of deep-etch plates and PS plates (presensitized plate), it is necessary to carry out, after development with water, such after-treatments as affinitizing by using an ink-receptivity-affording solution and a desensitizing solution and, if necessary, further by using an etching solution before sending to printing step. Accordingly, a considerable time is required in the plate preparing step.

On the other hand, there has been also known one step method which is considered to be an improvement over a conventional developer composition. Namely an emulsion of lacquer in water has been used as a single solution for developing a diazo-type photosensitized plate whereby effectiveness is attained in removing a diazo-type coated product and simultaneously in forming a lacquer film on printing parts. As a developer composition for such a diazo-type photosensitizing solution, there is disclosed a composition in Japanese patent publication No. 13,580/1965.

A novel type photosensitized plate capable of yielding a plate of a high printing resistance can be obtained from a solution containing a photopolymerizable component and a solvent thereof. For this kind of plate, there has never been developed one step method for carrying out development and subsequent after-treatments simultaneously.

An object of the present invention is to provide a composition for developing lithographic plates which enables to simplify the developing step of plates of high printing resistance obtained from a solution containing a photopolymerizable component and a solvent thereof, to improve ink-receptivity and to reduce ink-stain, ink-clinging, etc. of non-image portions.

Such an object can be attained by the present composition for developing lithographic plates.

According to the present invention there is provided a composition for developing lithographic plate having a photopolymerized layer obtained by exposing to actinic light a selected area of a coating of a photopolymerizable layer, said composition comprising (A) at least one developer base agent selected from the group consisting of ketones and cyclic ethers, (B) at least one ink-receptivity-affording agent selected from the group consisting of esters from a higher aliphatic saturated alcohol having 24 to 34 carbon atoms and a linear aliphatic saturated carboxylic acid having 12 to 18 carbon atoms, mixtures of said ester and said carboxylic acid, monoesters and diesters from said carboxylic acid and glycerin, and a mixture of colophony and white Japanese wax, and (C) at least one desensitizer selected from the group consisting of alkylamide type surfactants, phosphate type surfactants and acid amide type surfactants, said photopolymerizable layer being substantially constituted of:

(I) A photopolymerizable component comprising (A) an unsaturated polyester having a melting point above 100° C. whose molecular structure includes at least one segment (a) having the formula:

$$-\!\!\left(R_1-O\right)\!\!-_x$$

(wherein $R_1$ represents an alkylene group having 2 to 4 carbon atoms and $x$ is a number from 2 to 100) or having the formula:

$$-\left[(CH_2)_y-O-\overset{O}{\overset{\|}{C}}-R_2-\overset{O}{\overset{\|}{C}}-O-\right]_z-(CH_2)_y-$$

(wherein $R_2$ represents one of the following groups

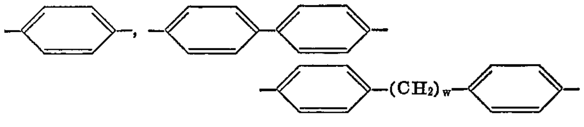

or a naphthylene group, Y is a number from 2 to 4; $z$ is a number from 1 to 10; and $w$ is a number from 1 to 4) and at least one segment (b) corresponding to the residue of an unsaturated dicarboxylic acid; (B) 10 to 150 parts by weight, per 100 parts by weight of said unsaturated polyester (A), of at least one ethylenically unsaturated monomer which is different from the monomer used in the preparation of the unsaturated polyester polymer (A); and (C) 0.001 to 10 parts by weight, per 100 parts by weight of said unsaturated polyester, of a photopolymerization initiator; (D) 0.005 to 3 parts by weight, per 100 parts by weight of said unsaturated polyester, of a thermal polymerization inhibitor.

(II) At least one solvent selected from the group consisting of chlorinated aliphatic hydrocarbons and ketones. Exemplary developer base agents include ketones such as acetone, methylethylketone, diethylketone, methylisobutylketone, methylhexylketone, acetophenone and cyclic ethers such as dioxane, dimethyl dioxane, tetrahydrofuran, dioxolan, 4-methyl dioxolan and the mixtures thereof. These compounds may be used together with at least one aliphatic alcohol having 1 to 4 carbon atoms such as methanol, ethanol, n-propanol, isopropanol and n-butanol.

The ink-receptivity treatment is a step which coats lacquer usually containing pitch as a principal ingredient in order to insure ink-receptivity to image portions of a printing plate and at the same time to prevent the corrosion of image by wetting water at the time of printing. The photopolymerized layer which forms image portions in the present invention, is naturally oleophilic and is excellent in ink-receptivity by itself, but by allowing to deposit an ink-receptivity-affording agent thereon, the effectiveness for making the ink-receptivity of the whole surface of a plate uniform may be attained. This treatment is carried out simultaneously with the development in one step.

As ink-receptivity-affording agent, rosin, wax (beeswax, paraffin wax), i.e. esters of a higher aliphatic saturated alcohol having 24 to 34 carbon atoms with a linear aliphatic saturated carboxylic acid having 12 to 18 carbon atoms, a mixture of the ester and the acid, mono- and diesters of the acid component and glycerin are illustrated. Exemplary higher aliphatic saturated alcohols include $C_{24}$ (lignoceryl) alcohol, $C_{26}$ (n-hexacosyl) alcohol, $C_{28}$ (n-octacosyl) alcohol, $C_{30}$ (n-triacontyl) alcohol, $C_{31}$ (melissyl) alcohol, $C_{34}$ (n-tetratriacontyl) alcohol. Exemplary linear aliphatic saturated carboxylic acids are $C_{12}$ (lauric) acid, $C_{14}$ (myristic) acid, $C_{16}$ (palmitic) acid, $C_{18}$ (stearic) acid. Besides, a mixture of a colophony whose principal ingredient is abietic acid, d-pimaric acid, etc. and while Japanese wax may also be used.

Examples of suitable desensitizers of the present invention include alkylamide type surfactants such as laurylamine acetate (Acetamine 24: trademark, manufactured by Kao Atlas Co.), hardened beef tallow amine acetate (Acetamine 86: trademark, manufactured by Kao Atlas Co)., octadecylamino dodecylamine (Amine AB; trademark, manufactured by Nippon Yushi Co.), pyridinium chloride (Softex KZ; trademark, manufactured by Kao Atlas Co.), polyoxyethylenealkylamide (Nimid S: trademark, manufactured by Nippon Yushi Co.); phosphate type surfactants such as dialkylphosphates (Electrostripper N: trademark, manufactured by Kao Atlas Co., and Electol 200: trademark, manufactured by Nippon Yushi Co.); and acid amide type surfactants such as oleic acid amide sulfonate (Diapon S: trademark, manufactured by Nippon Yushi Co.) and sebacamide sulfonic acid amide (Diapon T: trademark, manufactured by Nippon Yushi Co.).

Thus, the desensitization can be also carried out in the same one step by the simultaneous addition of a densitizer as the third component. The desensitization refered to herein means a treatment by which water affinity and ink-repellent property can be imparted to the non-image portions. Hydrophilic colloidal substances such as gum arabic, CMC, etc., organic acids, inorganic acids or salts thereof, has been conventionally employed for the desensitization of the non-image portions. The desensitizer coating of the non-image portions on a support such as aluminum plates, zinc plates, etc. increases the hydrophilic property of the non-image portions and prevents ink stain at the time of printing.

Since the present developer composition is used in the form of one solution for the attainment of various purposes, the above-mentioned three components must be dissolved uniformly and hence has a definite range of mixing ratio. However, so long as a uniform solution is formed, various mixing ratio of each component can be selected freely in practical use.

The mixing weight ratio of the developer base agent, the ink-receptivity-affording agent and the desensitizer is preferably in the range of 70–97:2–25:1–5.

It has also been found that by using an etching agent as the fourth component of the developer composition of this invention, an etching effect may be obtained by a single solution treatment. Etching refers to a process which is carried out with an etching solution to attain the effectivenesses for strengthening adhesion between a support and the desensitizer, and also for removing the residue on the non-image portions when compared with the case of the treatment carried out with a desensitizer alone.

Inorganic acids or their salts can be used as an etching agent, which is necessarily water-soluble. Nitric acid, ammonium nitrate, sodium nitrate, potassium nitrate, magnesium nitrate, phosphoric acid ($H_3PO_4$), potassium phosphate, ammonium hydrogen phosphate $$[(NH_4)_2HPO_4]$$

or the like can be illustrated. Also these compounds may well be used together with hydrochloric acid and its salts.

In case where an etching agent is used, the mixing weight ratio of the developer base agent, the ink-receptivity-affording agent, the desensitized and the etching agent is preferably in the range of 70–97:2–20–0.05–5:0.5–5.

Further the developer composition of the present invention can be diluted with water. In such a case, the weight ratio of the developer composition to water is in the range of 10:1 to 1:2, preferably 2:1 to 5:6.

The preparation of the developer compositions of the present invention can be effected by mixing the above-mentioned each components in a common mixing vessel at an ambient temperature with stirring.

By the use of the present developer composition, lithographic plates can be prepared through a single developing step after photopolymerization. Thus the present developer composition brings about a large reduction of time for plate-making and hence a great curtailment of plate-making cost.

When a lithographic plate having a photopolymerized layer from a specified photosensitizing solution containing a photopolymerizable component is subjected to several steps of developing, ink-receptive treatment, desensitizing treatment, and etch treatment, conventional known corresponding treating agents can be used. Namely it is possible to subject the lithographic plate after photopolymerization, and simple development to ink-receptive treatment by using a commercially available ink-receptivity-affording agent containing, as a principal agent, lacquer, pitch, etc., to desensitizing treatment by using a known desensitizing solution containing, as a principal agent, gum arabic and phosphate and further to etching by using an aqueous solution of phosphoric acid.

The lithographic plate thus obtained by such a conventional process consisting of two or three steps is not different from the lithographic plate obtained by using a developer composition of the present invention carried out one step in the points of ink-receptivity of image portions, stain of non-image portions etc. Accordingly, it is the greatest feature of the present developer composition that it gives, by only one solution, the effectiveness attainable by all the steps of conventional development and subsequent treatments.

On the other hand, any two or three combinations of conventional ink-receptivity-affording agent, desensitizer and etching agent cannot be used in the form of mixed solution, because phase separation occurs e.g. when ink-receptivity-affording agent and desensitized are mixed and their individual effectivenesses are cancelled by each other and the same phenomena appear also in cases of other combinations.

Among the four developer components, the three components of a developer base agent, an ink-receptivity-affording agent and a desensitized are essential ingredients but etching agent is not necessarily added. However, the three component system of developer composition is preferable in case where extent of surface graining of a support is shallow as in case of PS plates and a support which is only slightly grained. Whereas the four component system is mainly used in case where the photopolymerizable layer is relatively thick or a photosensitizing solution is used for a wipe-on plate. Namely, by the addition of etching agent, it is possible to completely remove the development residue in case of a relatively deeply grained support and to reduce the clinging of ink at the boundary between the image portions and the non-image portion at the time of printing.

The photosensitizing solutions of this invention comprise (I) a photopolymerizable component comprising (A) an unsaturated polyester, (B) at least one ethylenically unsaturated monomer, (C) a photopolymerization initiator and (D) a thermal polymerization inhibitor and (II) at least one solvent.

An unsaturated polyester in the photopolymerizable component is produced by the conventional condensation reaction of an "etherdiol" having the formula:

$$HO-(R_1-O)_x-H$$

(wherein $R_1$ represents an alkylene group having 2 to 4 carbon atoms; $x$ is a number from 2 to 100) or an "esterdiol" having the formula:

$$HO-\left[(CH_2)_y-O-\overset{O}{\overset{\|}{C}}-R_2-\overset{O}{\overset{\|}{C}}-O\right]_z-(CH_2)_y-OH$$

(wherein $R_2$ represents one of the following groups

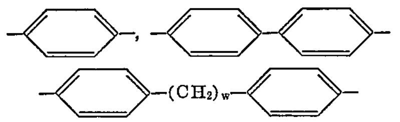

or a naphthylene group; $y$ is a number from 2 to 4; $z$ represents a number from 1 to 10; $w$ is a number from 1 to 4) or a mixture thereof with an unsaturated dicarboxylic acid or a derivative thereof, such as an anhydride or ester.

Exemplary etherdiols include polyethyleneglycols having 2 to 100 $-CH_2-CH_2O-$ groups in the main chain, polypropyleneglycols having 2 to 100 $-CH_2CH(CH_3)O-$ or $-CH_2CH_2CH_2CH_2O-$ groups in the main chain, polybutyleneglycols having 2 to 50

$$-CH_2CH_2CH_2CH_2O-$$

groups in the main chain and copoly(oxyethylene-oxypropylene)glycols having 2 to 50 $-CH_2CH_2O-$ and $CH_2CH(CH_3)O-$ groups respectively in the main chain.

The esterdiols may be easily and readily produced by the condensation reaction of a polymethyleneglycol having the formula:

$$HO-(CH_2)_y-OH$$

(wherein $y$ is a number from 2 to 4) with an aromatic dicarboxylic acid or the methyl or ethylester thereof having a formula:

$$R_3-O-\overset{O}{\overset{\|}{C}}-R_2-\overset{O}{\overset{\|}{C}}-O-R_3$$

(wherein $R_2$ represents one of the following groups

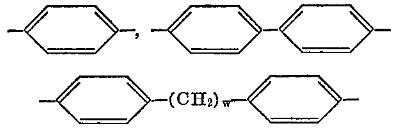

or a naphthylene group; $R_3$ represents a hydrogen atom or a methyl or ethyl group; $w$ is 1 to 4).

Such esterdiols are produced by (A) reacting the above-described polymethyleneglycol with, for example, the above-described aromatic dicarboxylic acid dimethylester in an inert gas atmosphere at a temperature between 150° and 300° C. in such amounts as to provide an esterdiol having a desired degree of polymerization or a desired molecular weight with the produced methanol being distilled off or by (B) adding a or more times moles of a polymethyleneglycol to, for example, an aromatic dicarboxylic acid dimethylester in an inert gas atmosphere at a temperature between 150° and 200° C. with the produced methanol being distilled off and raising the temperature of the resulting reaction mixture to between 200° and 300° C. and, if necessary, with the produced polymethyleneglycol being distilled off under reduced pressure to provide an esterdiol having a desired degree of polymerization or a desired molecular weight.

The polymethyleneglycols include, for example, ethyleneglycol, 1,3-propanediol and 1,4-butanediol.

Exemplary aromatic dicarboxylic acids or methyl or ethylesters thereof utilized for the preparation of the above-described esterdiols include terephthalic acid,
p,p'-biphenyldicarboxylic acid,
bis-(p-carboxyphenyl)-methane,
1,2-bis-(p-carboxyphenyl)-ethane,
1,3-bis-(p-carboxyphenyl)-propane,
1,4-bis-(p-carboxyphenyl)-butane,
1,5-naphthalene-dicarboxylic acid,
1,2-naphthalene-dicarboxylic acid,
2,6-naphthalene-dicarboxylic acid,
2,7-naphthalene-dicarboxylic acid and
dimethyl and diethylesters thereof.

Exemplary unsaturated dicarboxylic acids and derivatives thereof utilized for the preparation of the first component i.e. an unsaturated polyester include maleic acid, fumaric acid, citraconic acid, methaconic acid, itaconic acid, glutaconic acid, muconic acid, aconitic acid, lower alcohol esters thereof, for example, dimethyl and diethylesters thereof, maleic anhydride, citraconic anhydride.

In order to control the hardness of the photopolymerizable component after photopolymerization by varying the double bond equivalent (the molecular weight per one double bond) in an unsaturated polyester, a part of the segment (3) corresponding to an unsaturated dicarboxylic acid or the derivative thereof may be substituted with a saturated dicarboxylic acid or the derivative thereof. When the amount of such saturated dicarboxylic acid or the derivative thereof is more than 90 mole percent of an unsaturated dicarboxylic acid or the derivative thereof, the chemical resistance and the tensile strength of the photopolymerizable component after photopolymerization is unfavourably low.

Such saturated dicarboxylic acids and the derivatives thereof include, for example, malonic acid, methylmalonic acid, succinic acid, methylsuccinic acid, glutaric acid, sebacic acid, phthalic acid, isophthalic acid, terephthalic acid and the lower alcohol esters thereof such as dimethylesters and diethylester.

The unsaturated polyesters of this invention are produced by reacting said etherdiol or said esterdiol or the mixture thereof with said unsaturated dicarboxylic acid or the derivative thereof and, if necessary, said saturated dicarboxylic acid or the derivative thereof in an inert atmosphere at a temperature of 150° C. to 300° C. Thus produced unsaturated polyesters have a melting point above 100° C.

Examples of suitable copolymerizable ethylenically unsaturated monomers include acrylamides such as acrylamide, methacrylamide, N-hydroxymethylacrylamide, N-hydroxymethylmethacrylamide, N-methoxymethylacrylamide, N-methoxymethylmethacrylamide, N-ethoxymethylacrylamide, N-ethoxymethylmethacrylamide, N-butoxymethylacrylamide, N-butoxymethylmethacrylamide, N,N'-methylene bisacrylamide, N,N'-hexamethylenebismethacrylamide, acrylic acid and acrylates such as propyl acrylate, butyl acrylate, 2-hydroxyethyl acrylate, 2-hydroxypropyl acrylate, ethyleneglycol diacrylate, propyleneglycol diacrylate, diethyleneglycol diacrylate, triethyleneglycol diacrylate, polyethyleneglycol diacrylate (an average molecular weight of the polyethyleneglycol being below about 2000), polypropyleneglycol diacrylate (an average molecular weight of the polypropyleneglycol being below about 2000), 1,4-butyleneglycol diacrylate, glycerin triacrylate, trimethylol propane triacrylate, allyl acrylate, glycidyl acrylate, cyclohexyl acrylate, tetrahydrofurfuryl acrylate, methacrylic acid or methacrylates such as propyl methacrylate, butyl methacrylate, 2-hydroxyethyl methacrylate, 2-hydroxypropyl methacrylate, ethyleneglycol dimethacrylate, propyleneglycol dimethacrylate, diethylene glycol dimethacrylate, triethyleneglycol dimethacrylate (an average molecular weight of the polypropyleneglycol being below about 2000), 1,4-butyleneglycol dimethacrylate, glycerin trimethacrylate, trimethylolpropane trimethacrylate, allylmethacrylate, glycidyl methacrylate, cyclohexyl methacrylate, tetrahydrofurfuryl methacrylate; alpha-halo-substituted acrylic acid such as alpha-chloroacrylic acid, alpha-bromoacrylic acid, styrene and derivatives thereof such as p-vinylphenol, p-vinylbenzoic acid, divinylbenzene; vinyl esters such as vinylstearate, vinyl benzoate; allylesters such as allylmethacrylate, diallyl phthalate and N-vinyl phthalmide.

It is preferred to employ such an ethylenically unsaturated monomer in amounts of from 10 to 150 parts by weight based upon 100 parts by weight of the unsaturated polyester. When the amount of said unsaturated monomer is below 10 parts by weight, the rate of the photo crosslinking reaction is very slow and a mechanical strength after photo crosslinking is small for the practical use. When said amount is above 150 parts by weight, a brittleness after photo crosslinking is brought out and a chemical resistance is lowered.

Examples of suitable photopolymerization initiators include benzoins such as benzoin, alphamethylbenzoin, benzoin methyl ether, benzoin ethyl ether, alpha-phenylbenzoin, alpha-allylbenzoin; phenones such as acetophenone, benzophenone, omega-bromoacetophenone; disulphides such as diphenyl disulphide, tetraethylthiuram disulphide; diketones such as benzil, diacetyl; 2-naphthalene sulfonyl chloride; and anthraquinone and the derivatives thereof such as 1-chloro anthraquinone, beta-methyl anthraquinone, t-butyl anthraquinone, anthraquinone-1-carboxylic acid, anthraquinone-2-carboxylic acid and anthraquinone-1-sulfonic acid.

These photopolymerization initiators are preferably used in an amount of 0.001 to 10 parts by weight based upon 100 parts by weight of the unsaturated polyester. When the amount of the photopolymerization initiator is less than 0.001 part by weight, the photopolymerization reaction is greatly retarded and is too slow for practical commercial purposes. On the other hand, amounts of initiator of more than 10 parts by weight do not significantly increase the reaction and would be uneconomical.

Known thermal polymerization inhibitors may be employed for the purpose of maintaining storage stability (shelf life) of the photosensitizing solutions or the presensitized plates coated with the photosensitizing solutions. Such stabilizers may be added when the components of a photosensitizing solution are admixed or may be added to each component separately prior to admixing of the components.

Examples of suitable thermal polymerization inhibitors include hydroquinone, mono - tert - butylhydroquinone, phenothiazine, p-diaminobenzene, beta-naphthol, alpha-naphthol, naphthylamine, pyrogallol, cuprous chloride and nitrobenzene. These inhibitors are added only for completely preventing polymerization reaction without the actinic radiation set forth above without restraining the photopolymerization reaction. Consequently the amount of the stabilizers may preferably be about 0.005 to 3 parts by weight based upon 100 parts by weight of the unsaturated polyester.

Furthermore, various compounds such as fillers and plasticizers may be incorporated with the photopolymerizable compositions. These compounds include, for example, polymethylmethacrylates, polystyrenes, polyurethanes, polyvinylchlorides, poly(styrene-butadiene)-polymers, polybutadienes, natural rubbers, polyvinylbutyrals, polyvinylpyrrolidone, soluble polyamides, polyvinylacetates, alkyd resins, saturated polyesters, cellulose acetates, glass fibres, glass cloths, fine powdery silicon oxides, fine powdery calcium carbonate and mica.

The photosensitizing solutions are obtained by dissolving the photopolymerizable component in a solvent under heating with stirring at a temperature between 40° C. and 50° C. for about 5 hours in a conventional dissolving and mixing vessel.

The solvents according to the present invention include, chlorinated aliphatic hydrocarbons such as chloroform, tetrachloromethane, 1,2-dichloroethane, trichloroethylene, tetrachloroethylene, pentachloroethane; ketones such as acetone, methylethyl ketone, diethyl ketone, methylisobutyl ketone, methylhexyl ketone, acetophenone; a mixture solvent of a chlorinated aliphatic hydrocarbon and a ketone. There may also preferably be employed a lower aliphatic alcohol having 1 to 4 carbon atoms such as methanol, ethanol, n-propanol, isopropanol and normal butanol together with the above-described solvent. The weight ratio of the photopolymerizable component to the solvent is preferably in the range of 1:5 to 1:25, more preferably 1:8 to 1:12.

The photosensitizing solutions are coated on a support and then dried.

Examples of suitable support include paper such as resin and clay sized paper, resin coated paper, metals or alloys such as aluminium, zinc, copper, magnesium, aluminium plated with copper, iron plated with copper, copper plated with chromium, stainless steel or bronze, plastics such as polyesters, polyamides, polyvinylchlorides, polymethylmethacrylates or polystyrenes and cellulose esters. The thickness of these supports are preferably in the range of 0.1 to 2.0 mm. Especially aluminum plates of 0.3 to 0.5 mm. in thickness, zinc plates of 0.3 to 1.0 mm. in thickness and magnesium plates of 0.3 to 1.0 mm. in thickness are preferred.

The coating is applied by hand or by a conventional plate whirler, a roll coater or a curtain coater.

By using the photosensitizing solutions photopolymerized layers of any desired thickness of 2 to 200 microns with a high accuracy of thickness may be formed.

For example, in preparing a lithographic plate, a photosensitizing solution is coated on the surface of a support. After the solvent is removed by drying, the resulting plate is placed in a vacuum frame and exposed at room temperature to a source irradiating actinic radiation through, for example, a process negative film. The suitable time for exposure varies depending upon the thickness of layer of the photopolymerizable component while the time is almost constant with the conventional photosensitizing solution. After removal of the negative film, the plate is developed with the developer composition of this invention by a processor with a nozzle or brush or by hand with a soft sponge.

Practical sources of actinic radiation having wave lengths below 7,000 angstroms, generally between 2,000 and 5,000 angstroms include carbon arc lamps, high pressure mercury lamps, low pressure mercury lamps, UV fluorescent lamps and xenon lamps.

This invention will be further illustrated by the following examples which are in no way limiting the scope hereof. Parts are by weight unless otherwise indicated.

EXAMPLE 1

To 100 g. of the unsaturated polyester produced from the diol component and the dicarboxylic acid component set forth in Table I, were added 20 g. of acrylamide, 15 g. of styrene, 15 g. of glycidyl methacrylate, 2 g. of benzoin and 0.1 g. of hydroquinone, and 100 g. of the resulting mixture were dissolved in 2,000 g. of trichloroethylene-methanol in a ratio by weight of 2:1 to obtain a photosensitizing solution for lithography. A zinc plate of 0.5 mm. in thickness, grained at 600 mesh, was coated with the resulting photosensitizing solution by a plate whirler to prepare a photosensitizing plate having a photopolymerizable layer of 0.01 mm. in thickness. After drying, the plate was placed in a vacuum frame and exposed to a 500 w. mercury lamp at a distance of 0.5 m. for one minute through a half tone negative film of 150 lines per inch and then developed with 1,000 g. of a developer composition consisting of (a) 90 parts of a developer base agent containing dioxane, methylethyl ketone and ethanol in a ratio by weight of 16:3:1, (b) 7 parts of an ink-receptivity-affording agent containing an ester derived from palmitic acid and melissyl alcohol and palmitic acid in a ratio by weight of 10:1 and (c) 3 parts of, as a desensitizer, pyridinium chloride (trademark: Softex KZ, manufactured by Kao Atlas Co.). To apply the developing, the composition was uniformly poured onto the plate and the plate was uniformly wiped with a cellulose sponge by hand for 2 to 3 minutes. Thus there was obtained a printing plate having a superior ink-receptivity.

Preparation of esterdiol in Run 13

To 789 g. of ethyleneglycol were added 824 g. of dimethyl terephthalate and 0.5 g. of zinc acetate and the mixture was heated at a temperature of 180° C. to 200° C. for 80 minutes under a nitrogen atmosphere while 271 g. of the methanol were distilled off. The reaction temperature was gradually increased to a temperature of 220° C. to 240° C. and the resulting mixture was further reacted for 2.5 hours while 456 g. of ethyleneglycol were distilled off.

TABLE 1

| Run No. | Diol: Ether diol | Diol: Ester diol | Dicarboxylic acid: Unsaturated dicarboxylic acid | Dicarboxylic acid: Saturated dicarboxylic acid | Fusing point of unsaturated polymer (° C.) |
|---|---|---|---|---|---|
| 1 | Polyethyleneglycol (average molecular weight 200). | | Fumaric acid | | 110 |
| 2 | do | | do | Adipic acid | 104 |
| 3 | 1,4-butanediol | | Maleic acid | | 115 |
| 4 | do | | do | Adipic acid | 110 |
| 5 | | Ethyleneglycoldimethyl terephthalate (average molecular weight: 1,055). | Fumaric acid | | 184 |
| 6 | | do | do | Succinic acid | 180 |
| 7 | | 1,3-propaneglycol-p, p′-bisphenyl-dicarboxyl methyl (average molecular weight 2,286). | Itaconic acid | | 176 |
| 8 | | do | do | Succinic acid | 174 |
| 9 | Diethyleneglycol | 1,4-butanediol-dimethyl terephthalate. | Fumaric acid | | 151 |
| 10 | do | do | do | Adipic acid | 148 |
| 11 | do | Ethyleneglycol-naphthalic acid (average molecular weight 3,015). | Glutaconic acid | | 142 |
| 12 | do | do | do | Malonic acid | 140 |
| 13 | Poloxyethyleneglycol (average molecular weight 600). | Ethyleneglycol-dimethyl terephthalate (average molecular weight 1,055). | Fumaric acid | Adipic acid | 145 |
| 14 | Polypropyleneglycol (average molecular weight 400). | Ethyleneglycol-1,3-bis-p-carboxyl phenyl ethane. | do | do | 139 |

NOTE.—(1) Mole ratio of diol to dicarboxylic acid was 1:1; (2) Mole ratio of ether diol to ester diol was 4:6; (3) Mole ratio of unsaturated dicarboxylic acid to saturated dicarboxylic acid was 1:1.

Preparation of unsaturated polyester in Run 1

100 g. of polyethyleneglycol having an average molecular weight of 200 were maintained at a temperature of 220° C. to 240° C. under a nitrogen atmosphere and 58 g. of fumaric acid and 1 g. of p-toluenesulfonic acid were added thereto and the reaction was continued for 10 hours while the water produced was distilled off to give an unsaturated polyester having an acid value of 16 and a melting point of 110° C.

In Runs 2 to 4 the unsaturated polyesters were prepared in the same manner as in Run 1.

Preparation of esterdiol in Run 5

To 824 g. of dimethyl terephthalate and 789 g. of ethyleneglycol was added 0.5 g. of zinc acetate and the mixture was heated at a temperature of 180° C. to 200° C. under a nitrogen atmosphere. 271 g. of the methanol produced was distilled off and the resulting mixture was further heated at a temperature of 220° C. to 240° C. while 453 g. of ethyleneglycol was distilled off to give bis-beta-hydroxyethyl terephthalate having a degree of polymerization of 3.2

Preparation of unsaturated polyester in Run 5

To the resulting esterdiol were added 144 g. of fumaric acid and 3 g. of p-toluenesulfonic acid and the mixture was heated at 240° C. for 8 hours under a nitrogen atmosphere while the water produced was distilled off to give an unsaturated polyester having an acid value of 16.5 and a melting point of 184° C.

In Runs 6 to 8 the unsaturated polyesters were prepared in the same manner as in Run 5.

Preparation of unsaturated polyester in Run 13

To the resulting esterdiol were added 155 g. of fumaric acid, 105.5 g. of adipic acid and 3 g. of p-toluenesulfonic acid while the temperature was maintained at 240° C. After 30 minutes, 523 g. of polyethylene glycol having an average molecular weight of 600 was added to the mixture and the resulting mixture was reacted at 240° C. for 8 hours under a nitrogen atmosphere while the water produced was distilled off to give an unsaturated polyester having an acid value of 21.4 and a melting point of 145° C.

In Runs 9 to 12 and 14, the unsaturated polyesters were prepared in the same manner as in Run 13.

EXAMPLE 2

An aluminum plate of 0.3 mm. in thickness was coated with the same photosensitizing solution as in Example 1 of Table 1 to give a photosensitizing plate having a photopolymerizable layer of 0.01 mm. in thickness. Through a negative film of the test chart having letters of 7 to 34 points and a halftone image of 133 to 175 lines within the same negative, the plate was exposed for 3 minutes to 30 w. UV fluorescent lamps at a distance of 30 cm. A developer composition was prepared by mixing 80 parts of a developer base agent containing tetrahydrofuran and methyl alcohol in a 3:2 weight ratio, 10 parts of an ink-receptivity-affording agent of an ester of lauric acid with n-tetratriacontyl alcohol and 10 parts of an etching agent containing a 15% potassium nitrate solution and a 10% hydrochloric acid solution at a 1:1 weight ratio and diluting the resulting mixture with water in a ratio by weight of 1:1. The resulting developer composition was uniformly poured onto the plate and the plate was uniformly wiped with a cellulose sponge by hand for 3 minutes. Thus, a lithographic printing plate having a sharp image was obtained. This plate could be sufficiently inked on its surface by only one time inking with an ink roller.

EXAMPLE 3

An unsaturated polyester was prepared by a conventional polycondensation reaction using one mol part of polypropyleneglycol having an average molecular weight of 400, one mol part of ethyleneglycol, one mol part of fumaric acid and one mol part of terephthalic acid. To 100 g. of the resultant unsaturated polyester were added 20 g. of methylenebisacrylamide, 10 g. of styrene and 1.0 g. of ethylene acrylate, 2 g. of diphenyldisulfide and 0.1 g. of beta-naphthol. The photopolymerizable component was dissolved in 1,000 g. of acetophenone to give a photosensitizing solution. An aluminum plate having a thickness of 0.1 mm. was coated with the resultant photosensitizing solution by a plate whirler to obtain a photosensitizing plate having a photopolymerizable layer of 0.005 mm. in thickness. After drying, the plate was exposed through a halftone negative having 175 lines by inch for 15 minutes to a carbon arc lamp at a distance of 1 m. A developer composition was prepared by mixing 85 parts of a developer base agent containing dioxane, acetone and ethyl alcohol in a 14:1:5 weight ratio, 12 parts of an ink-receptivity-affording agent containing an ester derived from palmitic acid and melissyl alcohol and palmitic acid in a 10:1 weight ratio and 3 parts of nitric acid (specific gravity 1.35–1.44) as an etching agent. The resultant developer composition was further diluted with 50% by weight of the developer. Using the resultant developer composition, the above-mentioned plate was developed. As a result, the printing plate thus obtained was superior in the inking at the time of printing, and also no phenomenon such as scumming appeared. Thus, printing for a long period of time became possible without any surface treatment of the plate.

EXAMPLE 4

A magnesium plate of 0.5 mm. in thickness was coated with the same photosensitizing solution as in Example 3 to give a photosensitizing plate having a photopolymerizable layer of 0.015 mm. in thickness. The plate was exposed to a carbon arc lamp (200 v. 30 a.) through a halftone negative having 175 lines per inch at a distance of 1 m. A developer composition was prepared by mixing 90 parts of a developer base agent containing dimethyldioxane and ethanol in a 4:1 weight ratio, 5 parts of, as an ink-receptivity-affording agent, an ester of n-octacontyl alcohol with stearic acid, 3 parts of dialkylphosphate salt (trademark: Electrostripper made by Kao Atlas Co.) as a desensitizer; and 2 parts of diammonium hydrogen phosphate as an etching agent. Using the resultant developer composition, the above-mentioned plate was developed for 3 minutes by a processor with a spray nozzle. As a result, a printing plate having an image completely corresponding to that of the halftone negative, could be obtained, and also at the time of printing, a printing operation superior in inking, etc., could be effected without scumming.

EXAMPLE 5

To 100 g. of an unsaturated polymer obtained by reacting 1 mol part of polyethyleneglycol having an average molecular weight of 600, 0.5 mol part of furamic acid and 0.5 mol part of adipic acid, were added 20 g. of acrylic acid and 30 g. of acrylamide, 2 g. of benzoin and 0.05 g. of hydroquinone to prepare a photopolymerizable component. 15 g. of the photopolymerizable component thus prepared was dissolved in 1,500 g. of 1,2-dichloroethane carbon tetrachloride in a 1:1 weight ratio to give a photosensitizing solution.

An aluminum plate having a thickness of 0.05 mm., grained at 600 mesh, was coated with the photosensitizing solution by a curtain coater, to obtain a photosensitizing plate having a photopolymerizable layer of 0.02 mm. After drying, the plate was exposed for 1.5 minutes through a halftone negative having 150 lines per inch to a carbon arc lamp at a distance of 0.5 m. A developer composition was prepared by mixing 85 parts of dioxane-ethyl alcohol-water in a 7:1.5:1.5 weight ratio as a developer base agent, 10 parts of an ester of n-melissyl alcohol with lauric acid as an ink-receptivity-affording agent, 4 parts of a 60% nitric acid solution as an etching agent and 1 part of laurylamine acetate (trademark: Acetamine 24, a product of Kao Atlas Co.) as a desensitizer.

Using the developer composition thus prepared, the above-mentioned plate was developed for 3 minutes by a processor with a spray nozzle. As a result, at the time of printing, the hydrophilic property of the non-image portions was remarkably increased, and 100,000 or more prints could be obtained without any scumming.

EXAMPLE 6

A photopolymerizable component was prepared by mixing 100 g. of the unsaturated polymer obtained in Run 11 of Table 1, with 20 g. of acrylamide, 15 g. of propyl methacrylate, 10 g. of styrene, 0.5 g. of benzoin and 0.01 g. of p-methoxy-hydroquinone. 100 g. of the resultant photopolymerizable component was dissolved in 1,000 g. of chloroform to give a photosensitizing solution.

An aluminum plate of 0.1 mm. in thickness grained at 600 mesh was coated with the resulting photosensitizing solution by a plate whirler to prepare a photosensitizing plate having a photopolymerizable layer of 0.01 mm. in thickness. After drying, the plate was exposed for two minutes through a halftone negative having 150 lines per inch to a 2 kv. mercury lamp at a distance of 0.5 m.

A developer composition was prepared by blending 90 parts of a developer base agent containing acetophenone and ethanol in a 3:1 weight ratio, 6 parts of an ink-receptivity-affording agent containing an ester from n-tetratriacontyl alcohol and lauric acid and palmitic acid in a 8:1 weight ratio, 3 parts of a 60% nitric acid solution as an etching agent and 1 part of oleic amide sulfonic acid salt (trademark, Diapon S, manufactured by Nippon Yushi Co.) as a desensitizer.

Using the developer composition thus prepared, the above-mentioned plate was developed for 3 minutes by a processor with a spray nozzle. Using the printing plate thus obtained, printing was carried out by a high speed offset printing machine. As a result, clear prints could be obtained without any scumming on the surface of the printing plate.

EXAMPLE 7

100 g. of an unsaturated polyester obtained in Example 1 of Table 1, 25 g. of acrylic acid, 5 g. of styrene, 20 g. of glycidyl methacrylate, 0.5 g. of beta-methyl anthraquinone and 0.05 g. of nitrobenzene were thoroughly mixed and the mixture was dissolved in 1,000 g. of dichloroethane-n-propyl alcohol in a 9:1 weight ratio to give a photosensitizing solution. A variety of supports were coated with the photosensitizing solution by a plate whirler and dried to produce a photosensitizing plate. The plate was placed in a vacuum frame and exposed to a 2-kw. mercury lamp at a distance of 0.5 m. for 2 minutes through a halftone negative film of the test chart having 150 lines per inch and developed with the compositions set forth in Table 2 with a cellulose sponge by hand. As a result, printing could be carried out with an excellent inking and without any scumming on the surface of the printing plate and any clinging of ink. Also, clear prints could be obtained while faithfully reproducing the halftone negative film.

TABLE 2

| Run No. | Support (mm.) | Developer base agent weight ratio | Parts | Ink-receptivity affording agent, weight ratio | Parts | Desensitizing agent | Parts | Etching agent | Parts | Weight ratio of composition to water |
|---|---|---|---|---|---|---|---|---|---|---|
| 1 | Aluminum, 0.1 | Dioxane-ethanol, 3-1 | 85 | Lignocerylalcohol-myristic acid. | 10 | Lauryl acetate | 5 | — | — | — |
| 2 | Aluminum, 0.3 | do | 80 | do | 15 | do | 2 | Sodium nitrate. | 3 | 1:1 |
| 3 | Zinc, 0.5 | Diethyl ketone-dioxane-isopropanol 4:4:1. | 70 | do | 20 | Sebacamide sulfonate. | 6 | do | 4 | — |
| 4 | Aluminum-PS, 0.1 | do | 80 | Melissyl alcohol-palmitic acid. | 15 | do | 5 | — | — | 2:1 |
| 5 | Aluminum, 0.3 | do | 85 | do | 10 | do | 2.5 | Potassium phosphate. | 2.5 | — |
| 6 | Magnesium, 0.3 | Acetophenone | 85 | do | 10 | Dialkyl phosphate salt. | 4 | do | 1 | — |
| 7 | do | Dioxane | 85 | do | 10 | do | 4 | do | 1 | — |
| 8 | Aluminum, 0.3 | Methylhexylketone-n-butyl alcohol (6:1). | 75 | n-Octacosyl alcohol, stearic acid. | 15 | do | 5 | Ammonium nitrate. | 5 | 3:1 |

What is claimed is:

1. A composition for developing lithographic plate having a photopolymerized layer obtained by exposing to actinic light a selected area of a coating of a photopolymerizable layer, said composition comprising (A) at least one developer selected from the group consisting of ketones and cyclic ethers, (B) at least one ink-receptivity-affording agent selected from the group consisting of esters from a higher aliphatic saturated alcohol having 24 to 34 carbon atoms and a linear aliphatic saturated carboxylic acid having 12 to 18 carbon atoms, mixtures of said ester and said carboxylic acid, monoesters and diesters between said carboxylic acid and glycerin, and a mixture of colophony and white Japanese wax, and (C) at least one desensitizer selected from the group consisting of alkylamide type surfactants, phosphate type surfactants and acid amide type surfactants, wherein the mixing weight ratio of the developer; the ink-receptivity-affording agent; and the desensitizer is in the range of 70 to 97:2 to 5:1 to 5; said photopolymerizable layer being substantially constituted of:

(I) a photopolymerizable component comprising (A) an unsaturated polyester having a melting point above 100° C. and being the interpolymerization polycondensation reaction product of a diol component and an acid component wherein said diol component comprises an etherdiol (a) of the formula:

$$HO\!\left(R_1-O\right)_x\!H$$

wherein $R_1$ represents an alkylene group having 2 to 4 carbon atoms and $x$ is a number from 2 to 100 or an esterdiol (b) of the formula:

$$HO\left[(CH_2)_y-O-\overset{O}{\overset{\|}{C}}-R_2-\overset{O}{\overset{\|}{C}}-O\right]_z(CH_2)_y-OH$$

wherein $R_2$ represents one of the following groups

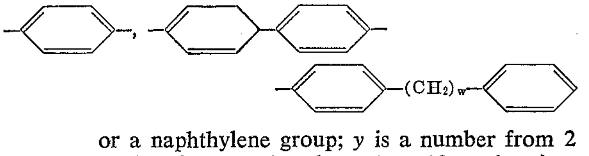

or a naphthylene group; $y$ is a number from 2 to 4; $z$ is a number from 1 to 10; and $w$ is a number from 1 to 4 and wherein said acid component comprises an unsaturated dicarboxylic acid, an anhydride thereof, or an ester thereof;

(B) 10 to 150 parts by weight, per 100 parts by weight of said unsaturated polyester (A), of at least one ethylenically unsaturated monomer which is different from the monomer used in the preparation of the unsaturated polyester polymer (A); and (C) 0.001 to 10 parts by weight, per 100 parts by weight of said unsaturated polyester, of a photopolymerization initiator;

(D) 0.005 to 3 parts by weight, per 100 parts by weight of said unsaturated polyester, of a thermal polymerization inhibitor, (II) at least one solvent selected from the group consisting of chlorinated aliphatic hydrocarbons and ketones.

2. A composition according to claim 1 wherein the developer is used together with at least one lower aliphatic alcohol having 1 to 4 carbon atoms.

3. A composition according to claim 1 comprising additionally at least one etching agent selected from the group consisting of water-soluble inorganic acids and the salts thereof.

4. A composition according to claim 2 comprising additionally at least one etching agent selected from the group consisting of water-soluble inorganic acids and the salts thereof.

5. A composition according to claim 1 wherein said solvent (II) is used together with at least one lower aliphatic alcohol having 1 to 4 carbon atoms.

6. A composition according to claim 3 wherein said solvent (II) is used together with at least one lower aliphatic alcohol having 1 to 4 carbon atoms.

7. A composition according to claim 1 comprising additionally water at a weight ratio of the composition to water being 10:1 to 1:2.

8. A composition according to claim 3 comprising additionally water at a weight ratio of the composition to water being 10:1 to 1:2.

9. A composition according to claim 3, wherein the mixing weight-ratio of the developer; the ink-receptivity-affording agent: the desensitizer: the etching agent is in the range of 70 to 97:2 to 20:0.5 to 5:0.5 to 5.

10. A composition according to claim 1, wherein the ketone is selected from the group consisting of acetone, methylethyl ketone, diethyl ketone, methylisobutyl ketone, methylhexyl ketone and acetophenone.

11. A composition according to claim 2, wherein the ketone is selected from the group consisting of acetone, methylethyl ketone, diethyl ketone, methylisobutyl ketone, methylhexyl ketone and acetophenone.

12. A composition according to claim 3, wherein the ketone is selected from the group consisting of acetone, methylethyl ketone, diethyl ketone, methylisobutyl ketone, methylhexyl ketone and acetophenone.

13. A composition according to claim 1, wherein the cyclic ether is selected from the group consisting of dioxane, dimethyl dioxane, tetrahydrofuran, dioxolan and 4-methyldioxolan.

14. A composition according to claim 2, wherein the cyclic ether is selected from the group consisting of dioxane, dimethyl dioxane, tetrahydrofuran, dioxolan and 4-methyldioxolan.

15. A composition according to claim 3, wherein the cyclic ether is selected from the group consisting of dioxane, dimethyl dioxane, tetrahydrofuran, dioxolan and 4-methyldioxolan.

16. A composition according to claim 2 wherein the lower aliphatic alcohol having 1 to 4 carbon atoms is selected from the group consisting of methanol, ethanol n-propanol, isopropanol and normal butanol.

17. A composition according to claim 5 wherein the lower aliphatic alcohol having 1 to 4 carbon atoms is selected from the group consisting of methanol, ethanol n-propanol, isopropanol and normal butanol.

18. A composition according to claim 6 wherein the lower aliphatic alcohol having 1 to 4 carbon atoms is selected from the group consisting of methanol, ethanol n-propanol, isopropanol and normal butanol.

19. A composition according to claim 1 wherein the higher aliphatic saturated alcohol is a member selected from the group consisting of lignoceryl, n-hexocosyl, n-octacosyl, n-triacontyl, melissyl, n-tetratriacontyl alcohols.

20. A composition according to claim 3 wherein the higher aliphatic saturated alcohol is a member selected from the group consisting of lignoceryl, n-hexocosyl, n-octacosyl, n-triacontyl, melissyl, n-tetratriacontyl alcohols.

21. A composition according to claim 1 wherein the linear aliphatic saturated carboxylic acid is selected from the group consisting of lauric acid, myristic acid, palmitic acid and stearic acid.

22. A composition according to claim 3 wherein the linear aliphatic saturated carboxylic acid is selected from the group consisting of lauric acid, myristic acid, palmitic acid and stearic acid.

23. A composition according to claim 3 wherein the etching agent is a member selected from the group consisting of nitric acid, ammonium nitrate, sodium nitrate, potassium nitrate, magnesium nitrate, phosphoric acid, potassium phosphate and ammonium hydrogen phosphate.

24. A composition according to claim 3 wherein the etching agent is employed together with a member selected from the group consisting of hydrochloric acid and the salt thereof.

25. A process for developing lithographic plate which comprises (A) obtaining a photopolymerized layer on said plate by exposing a selected area of a coating of a photopolymerizable layer to actinic light; wherein said photopolymerizable layer being substantially constituted of:

(I) a photopolymerizable component comprising (a) an unsaturated polyester having a melting point above 100° C. and being the interpolymerization polycondensation reaction product of a diol component and an acid component wherein said diol component comprises an etherdiol (1) of the formula:

$$HO\!\left(R_1-O\right)_x\!H$$

wherein $R^1$ represents an alkylene group having 2 to 4 carbon atoms and $x$ is a number from 2 to 100 or an esterdiol (2) of the formula:

$$HO\left[\left(CH_2\right)_y-O-\overset{O}{\overset{\|}{C}}-R_2-\overset{O}{\overset{\|}{C}}-O\right]_z\left(CH_2\right)_y-OH$$

wherein $R_2$ represents one of the following groups

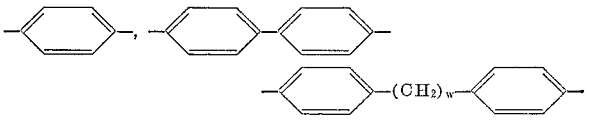

or a naphthylene group; $y$ is a number from 2 to 4; $z$ is a number from 1 to 10; and $w$ is a number from 1 to 4 and wherein said acid component comprises an unsaturated dicarboxylic acid, an anhydride thereof, or an ester thereof;

(b) 10 to 150 parts by weight, per 100 parts by weight of said unsaturated polyester (a), of at least one ethylenically unsaturated monomer which is different from the monomer used in the preparation of the unsaturated polyester polymer (a); and (c) 0.001 to 10 parts by weight, per 100 parts by weight of said unsaturated polyester, of a photopolymerization initiator;

(d) 0.005 to 3 parts by weight, per 100 parts by weight of said unsaturated polyester, of a thermal polymerization inhibitor;

(II) at least one solvent selected from the group consisting of chlorinated aliphatic hydrocarbons and ketones; and then (B) treating the plate with a developing composition comprising (I) at least one developer selected from the group consisting of ketones and cyclic ethers, (II) at least one ink-receptivity-affording agent selected from the group consisting of esters from a higher aliphatic saturated alcohol having 24 to 34 carbon atoms and a linear aliphatic saturated carboxylic acid having 12 to 18 carbon atoms, mixtures of said ester and said carboxylic acid, monoesters and diesters between said carboxylic acid and glycerin, and a mixture of colophony and white Japanese wax, and (III) at least one desensitizer selected from the group consisting of alkylamide type surfactants, phosphate type surfactants and acid amide type surfactants; wherein the mixing weight ratio of the developer; the ink-receptivity-affording agent; and the desensitizer is in the range of 70 to 97:2 to 25:1 to 5.

26. The process of claim 25 wherein said ketone is selected from the group consisting of acetone, methylethyl ketone, diethyl ketone, methylisobutyl ketone, methylhexyl ketone and acetophenone; and wherein said cyclic ether is selected from the group consisting of dioxane, dimethyl dioxane, tetrahydrofuran, dioxolan and 4-methyl dixolan.

27. The process of claim 25 wherein said higher aliphatic saturated alcohol is a member selected from the group consisting of lignoceryl, n-hexocosyl, n-octacosyl, n-triacontyl, melissyl, and n-tetratriacontyl alcohols.

28. The process of claim 25 wherein said linear aliphatic saturated carboxylic acid is selected from the group consisting of lauric acid, myristic acid, palmitic acid and stearic acid.

References Cited

UNITED STATES PATENTS

| | | | |
|---|---|---|---|
| 3,399,994 | 9/1968 | Watkinson | 96—48 |
| 3,019,106 | 1/1962 | Adams | 96—48 |
| 3,455,688 | 7/1969 | Adams et al. | 96—48 |

NORMAN G. TORCHIN, Primary Examiner

W. H. LOUIE, Jr., Assistant Examiner

U.S. Cl. X.R.

96—33. 35.1. 36: 101—456. 466: 106—218. 232. 236